United States Patent [19]
Doehler

[11] Patent Number: 5,374,313
[45] Date of Patent: Dec. 20, 1994

[54] MAGNETIC ROLLER GAS GATE EMPLOYING TRANSONIC SWEEP GAS FLOW TO ISOLATE REGIONS OF DIFFERING GASEOUS COMPOSITION OR PRESSURE

[75] Inventor: Joachim Doehler, Union Lake, Mich.

[73] Assignee: Energy Conversion Devices, Inc., Troy, Mich.

[21] Appl. No.: 47,975

[22] Filed: Apr. 14, 1993

Related U.S. Application Data
[63] Continuation-in-part of Ser. No. 903,417, Jun. 24, 1992.

[51] Int. Cl.⁵ .................. C23C 16/50; C23C 16/54
[52] U.S. Cl. ................... 118/719; 118/718; 118/723 E; 118/730; 118/733
[58] Field of Search ............. 118/718, 719, 723 MW, 118/723 MR, 723 E, 729, 730, 733

[56] References Cited

U.S. PATENT DOCUMENTS

| | | | |
|---|---|---|---|
| 4,438,724 | 3/1984 | Doehler et al. | 118/719 |
| 4,462,332 | 7/1984 | Nath et al. | 118/718 |
| 4,664,951 | 5/1987 | Doehler | 118/718 X |
| 4,763,601 | 8/1988 | Saida et al. | 118/718 |
| 5,266,116 | 11/1993 | Fujioka et al. | 118/718 |

Primary Examiner—R. Bruce Breneman
Assistant Examiner—Jonathan D. Baskin
Attorney, Agent, or Firm—Marvin S. Siskind

[57] ABSTRACT

Disclosed herein is an improved gas gate for interconnecting regions of differing gaseous composition and/or pressure. The gas gate includes a narrow, elongated passageway through which substrate material is adapted to move between said regions and inlet means for introducing a flow of non-contaminating sweep gas into a central portion of said passageway. The gas gate is characterized in that the height of the passageway and the flow rate of the sweep gas therethrough provides for transonic flow of the sweep gas between the inlet means and at least one of the two interconnected regions, thereby effectively isolating one region, characterized by one composition and pressure, from another region, having a differing composition and/or pressure, by decreasing the mean-free-path length between collisions of diffusing species within the transonic flow region. The gas gate preferably includes a manifold at the juncture point where the gas inlet means and the passageway interconnect.

15 Claims, 5 Drawing Sheets

MAGNETIC ROLLER GAS GATE EMPLOYING TRANSONIC SWEEP GAS FLOW TO ISOLATE REGIONS OF DIFFERING GASEOUS COMPOSITION OR PRESSURE

RELATED APPLICATION INFORMATION

This application is a continuation-in-part of U.S. application Ser. No. 07/903,417, filed Jun. 24, 1992.

FIELD OF THE INVENTION

This invention relates generally to isolating mechanisms for operatively interconnecting regions of differing gaseous composition and/or pressure. More specifically the instant invention relates to an improved gas gate wherein the passageway therethrough is provided with means for creating at least one region of transonic sweep gas flow, thereby effectively isolating one region, characterized by one composition and pressure, from another region, having a differing composition and/or pressure, by decreasing the mean-free-path length between collisions of diffusing species within the transonic flow region.

BACKGROUND OF THE INVENTION

The present invention is useful in apparatus for continuously fabricating photovoltaic devices on a web of magnetic substrate material by depositing thereonto successive amorphous-silicon alloy semiconductor layers in each of at least two adjacent, interconnected deposition chambers. The composition of each layer is dependent upon the particular gases introduced into and isolated from each of the deposition chambers. More particularly, the deposition chambers are operatively interconnected by a gas gate which includes a (1) relatively narrow passageway (1) through which the web of substrate material passes; and (2) adapted to substantially isolate the processes gases introduced into the first chamber from the process gases introduced into the adjacent deposition chamber. As disclosed in U.S. Pat. No. 4,462,332 to Nath et al., assigned to the assignee of the instant application and the disclosure of which is hereby incorporated by reference, it has been determined that despite the relatively small size of the gas gate passageway, dopant process gases introduced into one deposition chamber back diffuse into the adjacent chamber, thereby contaminating the process gases introduced thereinto and the semiconductor layer deposited in said adjacent chamber. The '332 patent disclosed apparatus (namely ceramic magnets positioned above the gas gate passageway for urging the magnetic substrate upwardly) by which the height dimension of the passageway could be reduced. The reduction in the height dimension of the passageway provided for a corresponding reduction of the back diffusion of dopant gases for a given flow rate, thereby decreasing the contamination of the process gases introduced into the intrinsic deposition chamber.

However, because the magnets urge the substrate into sliding contact with the upper passageway wall, frictional abrasion between the wall and the unlayered side of the substrate causes problems with the deposition apparatus such as, for example, wear of the upper passageway wall of the gas gate. Also, abraded particles of substrate and passageway wall material collect in the passageway and deposition chambers causing scratching of the layered side of the substrate and co-depositing with the semiconductor material, which causes short circuiting due to the protruding particles which cannot be fully covered by a one micron thick semiconductor alloy layer. The abrasion, in addition to being detrimental to the semiconductor layer and the equipment, limits the minimum thickness of the web of substrate material which can be realistically used due to possible tearing.

Additionally, as was disclosed in U.S. Pat. Nos. 4,438,724 and 4,450,786 each to Doehler et al., both assigned to the assignee of the instant application and the disclosures of which are hereby incorporated by reference, when the web of substrate material is urged against the upper wall of the passageway, the passageway is divided by the web of substrate into a relatively narrow upper portion, between the substrate and the upper passageway wall, and a relatively wide lower portion, between the substrate and the lower passageway wall. Also, irregular spacing between the substrate and the upper passageway wall occurred because waffling (warping) of the web of substrate material could not be entirely eliminated by the attractive force of the magnets. Much of the warping of the substrate is caused by heating of the substrate in the deposition chambers. The process gases, being inherently viscous (and especially viscous at the elevated deposition temperatures employed with glow discharge deposition processes), are unable to travel through the narrow upper portion with sufficient velocity to prevent cross-contamination of process gases from one deposition chamber to the other. It was to the end of decreasing the amount of cross-contamination of process gases through the narrow upper portion between the unlayered side of the substrate and the upper passage wall that the '724 and '786 patents were directed.

In the past, considerable efforts have been made to develop processes for depositing layers of amorphous semiconductor alloy material, each of which can encompass relatively large areas, and which can be doped to form p-type and n-type materials for the fabrication of p-i-n-type photovoltaic devices which are, in operation, substantially equivalent to their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films using silane ($SiH_4$) gas and hydrogen gas as precursors. The material so deposited is an intrinsic amorphous material consisting of silicon and hydrogen. To produce a doped amorphous material, phosphine gas ($PH_3$) for n-type or diborane gas ($B_2H_6$) for p-type conduction, is premixed with the silane gas. The material so deposited includes supposedly substitutional phosphorus or boron dopants and is shown to be extrinsic and of n or p conduction type.

It is now possible to prepare greatly improved amorphous silicon alloy materials, that have significantly reduced concentrations of localized states in the energy gap thereof, while providing high quality electronic properties by glow discharge as is fully described in U.S. Pat. No. 4,226,898 to Ovshinsky et al., and by vapor deposition as described in U.S. Pat. No. 4,217,374 to Ovshinsky et al., both assigned to the assignee of the instant application and the disclosures of which are hereby incorporated by reference. As disclosed in these patents, fluorine introduced into the amorphous silicon semiconductor operates to substantially reduce the density of localized states therein and facilitates the addition of other alloying materials, such as germanium. Activated fluorine readily diffuses into, and bonds to, amorphous silicon in a matrix body to substantially decrease the density of localized states therein. This is because the small size of the fluorine atoms enable them to be readily introduced into an amorphous silicon matrix. The fluorine is believed to bond to the dangling bonds of the silicon and form a partially ionic stable bond with flexible bonding angles, which results in a more stable and more efficient compensation or alteration than could be formed by hydrogen, or other compensating or altering agents which were previously employed.

The concept of utilizing multiple cells, to enhance photovoltaic device efficiency, was discussed at least as early as 1955 by E. D. Jackson, U.S. Pat. No. 2,949,498. The multiple cell structures therein discussed utilized p-n junction crystalline semiconductor devices. Essentially the concept is directed to utilizing different band gap devices to more efficiently collect various portions of the solar spectrum and to increase open circuit voltage ($V_{oc}$). The tandem cell device has two or more cells with the light directed serially through each cell, with a large band gap material followed by a smaller band gap material to absorb the light passed through the first cell or layer. By substantially matching the generated currents from each cell. the overall open circuit voltage is the sum of the open circuit voltages of each cell while the short circuit current remains substantially constant.

Due to the beneficial properties attained by the introduction of fluorine, amorphous alloys used to produce cascade type multiple cells may now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, the cell material maintains high electronic qualities and photoconductivity when the adjusting element(s) are added to tailor the device wavelength characteristics for a specific photoresponse application.

It is of obvious commercial importance to be able to mass produce photovoltaic devices. Unlike crystalline silicon which is limited to batch processing for the manufacture of solar cells, amorphous silicon semiconductor alloys can be deposited in multiple layers over large area substrates to form solar cells in a high volume, continuous processing system. Continuous processing systems of this kind are disclosed, for example, in U.S. Pat. Nos. 4,440,409; 4,542,711; 4,410,558; 4,438,723; and 4,492,181 each of which is assigned to the assignee of the instant application and the disclosures of which are hereby incorporated by reference. As disclosed in these patents, a substrate may be continuously advanced through a succession of deposition chambers, wherein each chamber is dedicated to the deposition of a specific semiconductor layer. In making a solar cell of p-i-n-type configuration, the first chamber is dedicated for depositing a p-type amorphous silicon semiconductor alloy material, the second chamber is dedicated for depositing an intrinsic amorphous silicon semiconductor alloy material, and the third chamber is dedicated for depositing an n-type amorphous silicon semiconductor alloy material. Since each deposited semiconductor alloy material, and especially the intrinsic semiconductor alloy material must be of high purity, the deposition environment in the deposition chamber is isolated from the doping constituents within the other chambers to prevent cross-contamination of doping constituents into the intrinsic process gases in the intrinsic chamber. In the previously mentioned patents, wherein the systems are primarily concerned with the production of photovoltaic cells, isolation between the chambers is accomplished by gas gates through which (1) a unidirectional flow of process gases between deposition chambers is established, and (2) an inert gas may be "swept" along the web of substrate material. The gas gate disclosed in previously mentioned U.S. Pat. No. 4,462,332 contemplated the creation of a plurality of magnetic fields adapted to urge the magnetic web of substrate material against a wall of the gas gate passageway opening so that the height dimension of the passageway opening could be reduced. The reduced height of the opening correspondingly decreased the quantity of process gas, which would otherwise diffuse from the dopant deposition chambers to the intrinsic deposition chamber, without correspondingly increasing the risk that the amorphous semiconductor layers deposited on the substrate would contact and be damaged by a wall of the gas gate passageway opening.

While the magnetic gas gate disclosed in U.S. Pat. No. 4,462,332 reduced the height dimension of the passageway opening, and thereby correspondingly reducing the diffusion of dopant gas, this gas gate design caused two additional problems, (1) the aforementioned problems of frictional, and (2) it divided the passageway into wide and narrow portions, as discussed hereinabove. Regarding the latter of these problems, the velocity of the inert sweep gas and residual process gases traveling through the wide lower portion is sufficiently great to substantially prevent cross-contamination of dopant gases into the intrinsic chamber. However, due to the viscosity of the process gases, the drag on the sweep gases along (1) the upper passageway wall and (2) the unlayered surface of the substrate (which define the relatively narrow upper portion of the passageway) results in a relatively low velocity flow therethrough. Accordingly, an undesirably high amount of dopant process gas is able to diffuse into the intrinsic chamber through the narrow upper portion.

The problem of cross-contamination was reduced in U.S. Pat. Nos. 4,438,724 and 4,450,786 by providing a plurality of elongated grooves (extending the entire length of the gas gate passageway opening) from the dopant deposition chamber to the adjacent intrinsic deposition chamber in the wall of the passageway opening above the web of substrate material. In this manner, a plurality of spaced, relatively high velocity flow channels were provided in the space between the unlayered surface of the web of substrate material and the upper wall of the passageway opening. Because the channels were relatively high, the sweep gases and residual process gases flowed unidirectionally therethrough at substantial velocities despite the drag incurred as said gases contacted the passageway wall and the substrate surface. While the gas gate of the '724 and '786 patents reduced the problem of cross-contamination through the aforementioned narrow upper section, it failed to reduce the problem of frictional abrasion between the unlayered side of the substrate and the upper passageway wall.

The magnetic roller gas gate of our copending U.S. application Ser. No. 07/903,417, filed Jun. 24, 1992 and hereby incorporated by reference, substantially reduced the frictional abrasion between the unlayered side of the substrate and the passageway wall without substantially increasing in the cross-contamination of process gases between deposition chambers.

While the magnetic roller gas gate of the '417 application reduced the frictional abrasion problem and did not increase the cross contamination problem, the gas gates of the prior art cannot be used to operatively interconnect regions having a pressure differential between the chambers of greater than about 10%. However in many instances, it is desirable, if not essential, to interconnect two processing chambers having pressure differentials of greater than an order of magnitude (i.e., such as pressures of $10^{-1}$ and $10^{-3}$ Torr respectively). Therefore, it is an object of the instant invention to fabricate a gas gate which incorporates the reduced frictional abrasion of the substrate and low cross contamination of the magnetic roller gas gate of the '417 application and has the additional ability to be used to interconnect regions having pressure differentials greater than about one order of magnitude.

Although the foregoing discussion dealt with a single dopant deposition chamber and an adjacent intrinsic deposition chamber, it should be apparent that other deposition chambers may be operatively connected by the gas gates of the present invention. For example, a p-type deposition chamber may be connected on one side of the intrinsic deposition chamber and an n-type deposition chamber may be connected to the other side of the intrinsic deposition chamber so as to produce a p-i-n type semiconductor device. Alternatively, a plurality of these triads of deposition chambers could be interconnected to produce a plurality or p-i-n-type cells. Similarly, a chamber in which the transparent conductive oxide layer (discussed hereinafter) is added atop the uppermost amorphous semiconductor alloy layer may be operatively connected by the improved gas gates, disclosed herein, to the final deposition chamber. Since it would be undesirable to have gaseous constituents or other contaminants introduced into the transparent conductive oxide (TCO) deposition chamber (typically at a pressure of about $10^{-3}$ Torr pressure) cross-contaminated into the RF glow-discharge dopant deposition chamber (typically at a pressure of about 1 Torr pressure), the improved gas gate of the present invention can also be employed between the TCO chamber and the final dopant deposition chamber. For that matter, the improved gas gate of the instant invention is applicable between all chambers of the continuous production apparatus so as to produce high quality amorphous photovoltaic devices.

BRIEF SUMMARY OF THE INVENTION

Disclosed herein is an improved gas gate for interconnecting regions of differing gaseous composition and/or pressure. The gas gate includes a narrow, elongated passageway through which substrate material is adapted to move between said regions and inlet means for introducing a flow of non-contaminating sweep gas into a central portion of said passageway. The gas gate is characterized in that the height of the passageway, the pressure in the adjacent region and the flow rate of the sweep gas therethrough provides for transonic flow of the sweep gas between the inlet means and at least one of the two interconnected regions. The gas gate preferably includes a manifold at the juncture point where the gas inlet means and the passageway interconnect.

In the present invention, a plurality of rollers are spacedly disposed and rotatably mounted within the upper passageway wall of the gas gate passageway toward which the unlayered surface of the substrate is urged. The rollers extend the entire width of the passageway. Magnets may be enclosed within said rollers or may be positioned elsewhere within the gas gate, so long as they provide the proper magnetic force so as to urge the substrate into rolling contact with said rollers.

When the isolation device of the instant invention is used in apparatus for the production of amorphous semiconductor solar cell devices, the interconnected regions can be adjacent deposition chambers adapted to deposit amorphous silicon semiconductor alloys. For example, a first layer may be deposited onto one surface of a substrate in a first chamber, the substrate can then pass through the isolation gas gate to a second chamber wherein a second layer is deposited atop the first layer. If p-i-n type photovoltaic cells are being fabricated, the intrinsic deposition chamber includes a conduit through which at least one process gas is introduced and the dopant deposition chambers include a conduit through which at least one additional process gas, not introduced into the intrinsic deposition chamber, is introduced.

DETAILED DESCRIPTION OF THE INVENTION AND DRAWINGS

I. The Photovoltaic Cell

Figure 1:
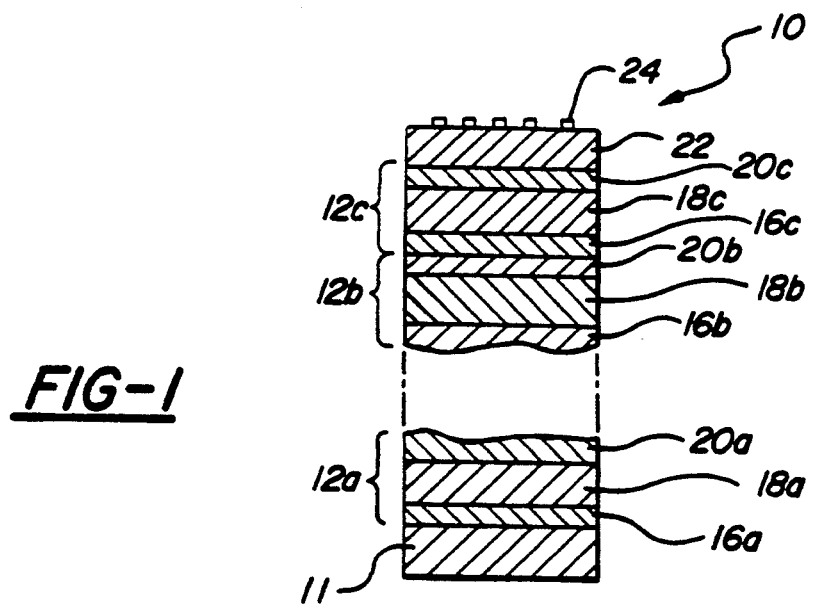
FIG. 1 is a fragmentary, cross-sectional view of a tandem or cascade photovoltaic device comprising a plurality of p-i-n-type cells, each layer of the cells formed from an amorphous silicon alloy material.

Referring now to the drawings and particularly to FIG. 1, a tandem or cascade-type photovoltaic cell, formed of successive p-i-n layers each including an amorphous silicon alloy material, is shown generally by numeral 10. It is for the production of this type of photovoltaic device, wherein layers of amorphous silicon alloy material are continuously deposited onto a moving web of substrate material in isolated deposition chambers, that the improved magnetic gas gates of the present invention were developed.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous semiconductor material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c include an amorphous semiconductor body containing at least a silicon alloy. Each of the semiconductor bodies include an n-type conductivity region or layer 20a, 20b and 20c; an intrinsic region or layer 18a, 18b and 18c; and a p-type conductivity region or layer 16a, 16b and 16c. The term "amorphous" as used herein includes all materials exhibiting long-range disorder, regardless of their short or intermediate range order and regardless of whether those materials are otherwise labeled polycrystalline or crystalline. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the gas gates of this invention are equally adapted for use in a multiple chamber apparatus which is adapted to produce tandem n-i-p cells by simply reversing the order of depositing the n-type and p-type layers onto the substrate.

For each of the cells 12a, 12b and 12c, the p-type layers of semiconductor material are characteristically light transmissive and highly conductive. The intrinsic layers of semiconductor material are characterized by an adjusted wavelength threshold for solar photoresponse, high light absorption, low dark conductivity and high photoconductivity, including sufficient amounts of a band gap adjusting element or elements to optimize the band gap for the particular cell application.

Preferably, the intrinsic layers of semiconductor material are band gap adjusted to provide cell 12a with the lowest band gap, cell 12c with the highest band gap and cell 12b with a band gap between the other two. The n-type layers of semiconductor material are characterized by low light absorption and high conductivity. The thickness of the band gap adjusted layers of intrinsic material can be between 2,000 to 3,000 angstroms. The thickness of the n-type layers can be in the range of 25 to 100 angstroms, the thickness of the p-type layers can be between 50 to 200 angstroms. Due to the shorter diffusion length of the holes, the p-type layers generally will be as thin as possible.

It is to be understood that following the deposition of the layer of semiconductor material, a further deposition step may be either performed in a separate environment or as a part of the continuous production apparatus. In this step, a TCO (transparent conductive oxide) layer 22 is added, which layer may, for example, be indium tin oxide (ITO), cadmium stannate ($Cd_2SnO_4$), or doped tin oxide ($SnO_2$). Although an electrode grid 24 may be added to the device, for a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Glow Discharge Deposition Chambers

Figure 2:
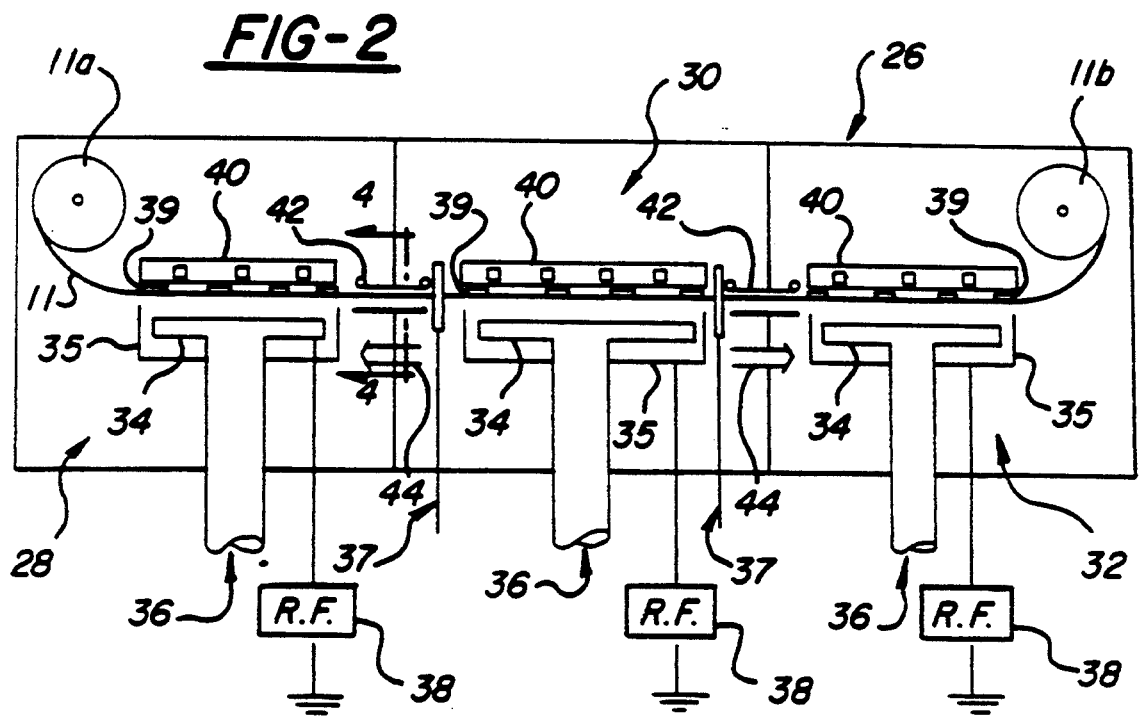
FIG. 2 is a diagrammatic representation of a multiple glow discharge chamber deposition system adapted for the continuous production of the photovoltaic devices shown in FIG. 1, which system includes gas gates for substantially isolating the gaseous constituents introduced into each of the deposition chambers.

Turning now to FIG. 2, a diagrammatic representation of a multiple glow discharge chamber deposition apparatus for the continuous production of the tandem photovoltaic cells, previously described, is generally illustrated by the reference numeral 26. The apparatus 26 includes a plurality of dedicated deposition chambers, adjacent chambers of which being operatively interconnected by an improved magnetic gas gate in accordance with the principles of the present invention. The term "isolated" as used herein will mean that the reaction gas mixture introduced into one of the adjacent deposition chambers is substantially prevented from cross-contaminating the mixtures introduced into the adjacent chamber. Note that the word "substantially" was used to modify "prevented"; this is because no isolation mechanism is 100% effective. Moreover, very slight back diffusion of dopant gas mixtures into the intrinsic deposition chamber has been found to provide a desirable profiling of the intrinsic layer. However, this compensation of the intrinsic layer should be minimal (in the parts per million range) and should be capable of quantitative determination. Finally, the term "dedicated" will be defined herein as meaning that each individual deposition chamber has introduced thereinto a particular reaction gas mixture protected from contamination from reaction gas mixtures introduced into adjacent deposition chambers and from environmental conditions.

The apparatus 26 is adapted to deposit a high volume of large area, amorphous photovoltaic cells having a p-i-n configuration onto the surface of a substrate 11 which is continually fed therethrough. To deposit the layers of amorphous semiconductor material required for producing a tandem cell of the p-i-n configuration, the apparatus 26 includes at least one triad of deposition chambers, each triad comprising: a first deposition chamber 28 in which a p-type conductivity layer of amorphous silicon alloy material is deposited onto the surface of the substrate 11 as the substrate 11 passes therethrough; a second deposition chamber 30 in which an intrinsic layer of amorphous silicon alloy material is deposited atop the p-type layer on the surface of the substrate 11 as the substrate 11 passes therethrough; and a third deposition chamber 32 in which an n-type conductivity layer of silicon alloy material is deposited atop the intrinsic layer on the surface of the substrate 11 as the substrate 11 passes therethrough.

It should be apparent that: (1) although one triad of deposition chambers has been described, additional triads or additional individual chambers may be added to the apparatus to provide the apparatus with the capability of producing photovoltaic cells having any number of layers; (2) the improved magnetic gas gates of the present invention is applicable in an environment with as few as two adjacent chambers wherein prevention of cross-contamination of gases between those chambers is required; (3) although in the preferred embodiment, the substrate material is shown and described as a continuous web of magnetic material, the concept of the present invention may be adapted for depositing successive layers atop discrete magnetic substrate plates which can be continuously fed through the plurality of deposition chambers; (4) although not shown, other chambers (such as a chamber for adding a TCO layer atop the uppermost dopant layer of the photovoltaic device) may be operatively connected to the glow discharge apparatus 26 by the magnetic gas gate of the present invention; and (5) the substrate supply core 11a and the substrate take-up core 11b are shown in the deposition chambers for illustrative purposes only and in reality the cores would be rotatably positioned in separate chambers operatively connected to the deposition chambers.

Each deposition chamber 28, 30 and 32 of the triad is adapted to deposit a single layer of amorphous silicon alloy material by glow discharge deposition, onto the magnetic substrate 11. To that end, each of the deposition chambers 28, 30 and 32 includes: a cathode 34; a shield 35 disposed about three sides of each of the cathodes 34; a gas supply conduit 36; an inert sweep gas conduit 37 disposed on opposed sides of the intrinsic deposition chamber; a radio frequency generator 38; a plurality of transversely extending magnetic elements 39; a plurality of radiant heating elements shown schematically as 40 in FIG. 2; and a gas gate 42 operatively connecting each deposition chamber. Note that while the gases are shown as flowing through the cathodes, this is solely for the purpose of illustration and in reality, the gases are introduced to flow about the cathode assembly as disclosed in U.S. Pat. No. 4,462,333.

The supply conduits 36 are operatively associated with the respective cathodes 34 to deliver process gas mixtures to the plasma regions created in each deposition chamber 28, 30 and 32 between said cathodes 34, the cathode shield 35 and the substrate 11. The cathode shields 35 operate in conjunction with the web of substrate material 11 to substantially confine the plasma within the cathode region of the deposition chambers. Although not shown, it should be apparent that exhaust conduits are also associated with each deposition chamber for withdrawing unused gases and undeposited plasma from a position adjacent the shielded cathode region.

The radio frequency generators 38 operate in conjunction with the cathodes 34, the radiant heaters 40 and the grounded substrate 11 to form the plasma regions by dissociating the elemental reaction gases entering the deposition chambers 28, 30 and 32 into deposition species. The deposition species are then deposited onto a surface of the substrate 11 as layers of amorphous semiconductor material. The substrate 11 is maintained substantially flat by a plurality of rows of magnetic elements 39 which provide an attractive force urging the elongated substrate out of its normal sagging path of travel. In this manner, as fully disclosed in U.S. Pat. No. 4,440,107, assigned to the assignee of the instant application and the disclosure of which is hereby incorporated by reference, uniform layers of amorphous silicon alloy material may be deposited onto said substrate.

To form the photovoltaic cell 10 illustrated in FIG. 1, an n-type layer of amorphous silicon alloy material is deposited onto the substrate 11 in the deposition chamber 28, an intrinsic layer of amorphous silicon alloy material is deposited atop the n-type layer in the deposition chamber 30 and a p-type layer of amorphous silicon alloy material is deposited atop the intrinsic layer in the deposition chamber 32. As a result, the apparatus 26 successively deposits at least three layers of amorphous silicon alloy material onto the substrate 11 wherein the intrinsic layer deposited in deposition chamber 30 differs in composition from the layers deposited in deposition chamber 28 and 32 by the absence of at least one element which will be referred to as the dopant or doping species.

It is important that each of the layers (and particularly the intrinsic layer) deposited onto a surface of the magnetic substrate 11 be of high purity in order to produce high efficiency photovoltaic devices 10. It is therefore necessary to substantially prevent the cross-contamination of process gases into other deposition chambers. In order to prevent back diffusion of process gases to the intrinsic deposition chamber 30 from the dopant deposition chambers 28 and 32 through the gas gates 42, the p-dopant deposition chamber 28 and the n-dopant deposition chamber 32 are maintained at a lower internal pressure than the intrinsic deposition chamber 30. To that end, each deposition chamber may be provided with automatic throttle valves, pumps, and manometers (not illustrated). Each throttle valve is operatively connected to a respective pump so as to evacuate excess and spent deposition constituents from the deposition chambers. Each absolute manometer is operatively connected to a respective deposition chamber and a respective one of the throttle valves for controlling the pressure within said deposition chambers. Hence, a constant pressure differential is established and maintained between adjacent chambers.

In the preferred embodiment, a sweep gas such as hydrogen, argon, or another substantially inert gas is introduced adjacent the intrinsic deposition chamber side of the gas gates 42. In the illustrated embodiment, the sweep gas enters the gas gates 42 through conduits 37 which include apertures (not shown) for directing said gas on both sides of the magnetic web of substrate material 11. Due to the pressure differential which has been established, the inert sweep gas unidirectionally moves through the passageway 43 of the gas gates 42. The process gases for depositing the intrinsic layer are introduced into the intrinsic chamber 30 through conduit 36 and are substantially restricted to the plasma region of the chamber 30 by (1) the cathode shield 35 and (2) introducing and withdrawing these gases adjacent the cathode region. In a like manner, the process gases for depositing the dopant layers are introduced into the dopant chamber 28 and 32 through conduits 36 and are also substantially restricted to the plasma regions of the dopant chambers by (1) the cathode shields 35 and (2) introducing and withdrawing those gases adjacent the cathode regions. After the inert gas is swept through the gas gates 42 into the respective dopant deposition chambers, said inert gas may either be substantially withdrawn adjacent the dopant chamber side of the gas gates 42 or may be evacuated with the dopant process gases.

III. Magnetic Gas Gates

A. Sliding, Magnetic Gas Gate of the Prior Art

In an attempt to isolate the process gases introduced into the intrinsic deposition chamber 30 from the process gases introduced into the dopant deposition chambers 28 and 32, a unidirectional flow (in the direction of arrow 44) from the intrinsic deposition chamber 30 into either of the dopant deposition chambers 28 and 32 is established. As is readily apparent from FIG. 2, the intrinsic deposition chamber 30 is in operative communication with the dopant deposition chambers 28 and 32 by the gas gates which are illustrated as slots 42. The gas gates 42 are sized and shaped so as to permit the substrate 11 to travel through the passageway 43 as the substrate continuously moves from the supply core 11a, through the deposition chambers 28, 30 and 32, and is wound onto the take-up core 11b. Initially, the dimensional height of the gas gate passageway 43 was selected to be as small as possible to prevent back diffusion of the dopant process gases, while still being sufficiently large for the surface of the substrate on which the layers of amorphous semiconductor material are deposited, to pass therethrough without contacting and being scratched by the walls of the passageway 43. The prior art magnetic gas gate disclosed in U.S. Pat. No. 4,462,332 was designed to provide a reduced passageway opening which would still permit contact-free passage of the layered substrate 11 therethrough while reducing back diffusion of process gases from dopant deposition chambers such as 30 and 32 therethrough.

Figure 3:
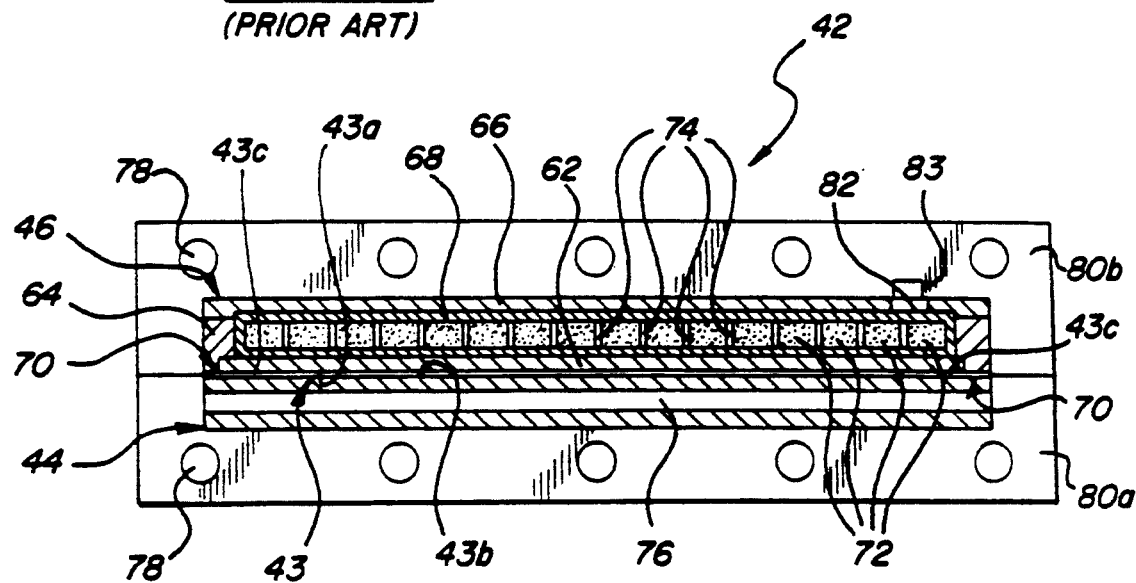
FIG. 3 is a cross-sectional view illustrating the arrangement of magnets and separators within a recess formed in the upper block of a magnetic gas gate assembly of the prior art.

FIG. 3 is an enlarged cross-sectional view of one magnetic gas gate design of the prior art, indicated generally by the reference numeral 42. The prior art gas gate 42 generally comprises a lower block 44 and an upper block 46. Secured to the leading edge of the upper block 46 is means for guiding the magnetic web of substrate material 11 through a relatively narrow passageway 43 formed between the top surface of the lower gas gate block 44 and a cut-out portion of the upper gas gate block 46. It is through this passageway 43 that the web of substrate material passes and the unidirectional flow of the inert sweep gas from the intrinsic deposition chamber into the adjacent dopant deposition chambers is established.

The gas gate passageway 43 of this prior art device is generally rectangular in cross-sectional configuration and is defined by an upper wall 43a, an opposed lower wall 43b and opposed side walls 43c. As previously mentioned, it is desirable that the height of the side walls 43c be minimized to correspondingly minimize the back diffusion of gases through the passageway 43. To accomplish that objective, the upper wall 43a of the passageway 43 is fabricated from a tempered glass sheet 62 such as "PYREX" (registered trademark of Corning Glass Works for a borosilicate glass having a softening temperature of 820° C., an upper working temperature in normal service of 230° C. and a scleroscope hardness of 120).

The passageway 43 is partially formed by a recess 64 in the upper block 46 into which is secured the magnetically attractive assembly which is adapted to urge the magnetic substrate 11 into sliding contact with the lower surface of the glass sheet 62. More particularly, an aluminum plate 66, a stainless steel enclosure 68 and the glass plate 62 are successively placed into the recess 64. A pair of elongated, relatively thin spacers 70 (1) form the side walls 43c of the passageway 43, and (2) fix the height of the passageway opening. Although the preferred height of the spacers is one-eighth (⅛) inch, the height dimension has, in practice, been reduced to a value as small as one-sixteenth (1/16) inch. As the size of the passageway opening is decreased, the amount of dopant gases back diffusing through the passageway 43 from the dopant deposition chamber 28 and 32 is correspondingly reduced. The decrease in the passageway opening from the previous one-quarter inch dimension to the one-sixteenth inch value, which is made possible by the use of magnetic gas gates, resulted in a decrease of back diffusion by at least a factor of one-hundred (100).

Inside the stainless steel enclosure 68, a plurality of one (1) inch wide by two (2) inch long ceramic magnets 72 are arranged in rows and columns by a plurality of horizontally and vertically arranged magnet separators 74. The magnets 72 are preferably fashioned from ceramic material although other magnetic materials may be used. It is preferable that a plurality of bar magnets be used to create the total magnetic field. This is because the greatest magnetic flux is developed at the ends of the bar magnets 72 and therefore the more magnets used, the greater the attractive force and the more uniform the magnetic field.

The magnetic separators 74 are substantially flat, elongated, non-magnetic elements, such as one-sixteenth (1/16) inch thick aluminum plates. The separators 74 cooperate with the plurality of magnets 72 to enhance the uniformity of the magnetic field. In the preferred embodiment, a total of sixty-four (64) one (1) inch by two (2) inch ceramic magnets 72 are so spaced by the non-magnetic separators 74 that the ends of the peripheral magnets 72 terminate coincidentally with the edge of the magnetic web of substrate material 11 traveling through the passageway 43. By so arranging the magnets 72 relative to the magnetic substrate 11, the established magnetic field also centers the substrate 11 as it travels through the gas gate 42. The upper block 46 includes a two-piece retainer (not shown) for holding the magnets 72 and separators 74 in the prearranged pattern.

The top surface of the lower block 44 of the gas gate 42 forms the lower wall 43b of the passageway 43. Both the lower block 44 and the upper block 46 of the gas gate 42 include a plurality of apertures 78 in panels 80a and 80b, respectively, for mounting the gas gate 42 to the bulkhead between adjacent deposition chambers. Further, a port 82 provides access into the upper block 64 and the aluminum plate 66 for establishing communication with the recess 64. In this manner, the recess 64 can be pumped after the magnetic gas gate apparatus is inserted thereinto and the port 82 can be sealed by plug 83 to prevent contamination of the deposition chambers caused by outgassing of the magnets 72.

The magnetic field developed by the ceramic magnets 72 urges the unlayered side of the magnetic web of substrate material 11 (fabricated from a material such as 430 stainless steel) traveling through the passageway 43 in the gas gate 42 into sliding contact with the surface of the upper wall 43a. The ceramic magnets 72 develop a uniform magnetic field with very strong forces in a direction perpendicular to the planar surface of the substrate 11 traveling through the passageway 43, but relatively weak forces in a direction parallel to said planar substrate surface.

The magnetic field established when the magnetic gas gate assembly urged the magnetic substrate 11 into sliding contact with the upper wall 43a of the passageway 43, provided for a reduction in the size of the passageway opening without requiring special tolerances to prevent scratching of the unlayered substrate surface. However, as previously explained, while the total back diffusion decreased, the back diffusion between the upper passageway wall and the unlayered substrate surface increased. This is because the web of substrate material 11 divides the magnetic gas gate passageway opening 43 into a relatively narrow upper slit 82 and a relatively wide lower slit 84. It is in the relatively narrow upper slit 84 that the viscous sweep gases are unable to attain sufficient velocity to prevent back diffusion of dopant gases from the dopant chambers 28 and 32 into the intrinsic chamber 30.

B. Grooved, Magnetic Gas Gate of the Prior Art

Figure 4:
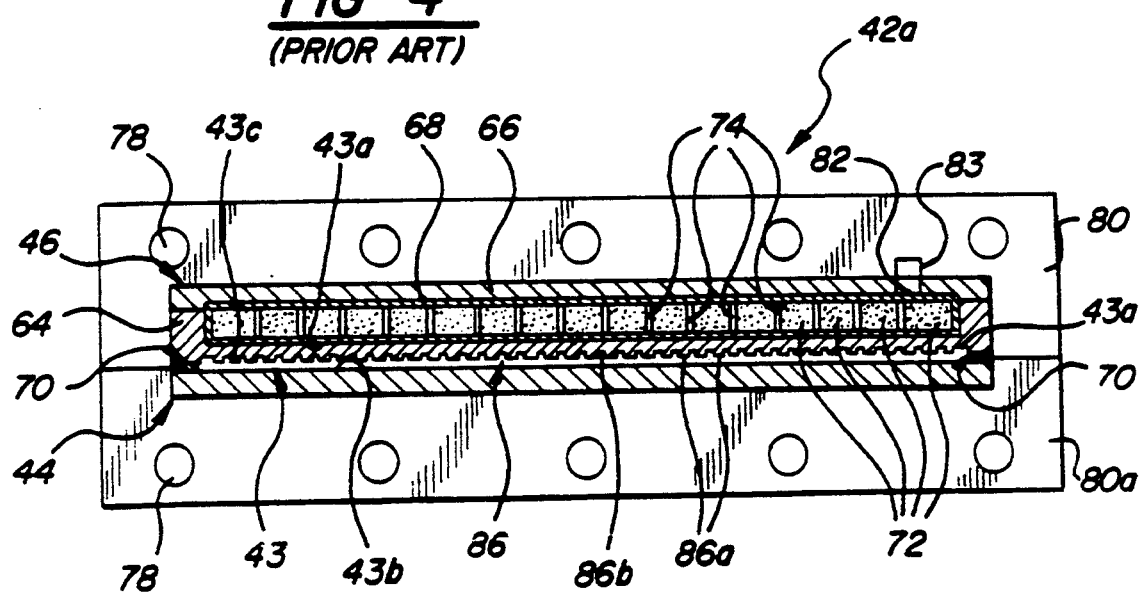
FIG. 4 is an enlarged cross-sectional view taken along line 4—4 of FIG. 2 illustrating the disposition of magnetic elements relative to the grooved flow channels, formed in the upper passageway wall, of the grooved gas gate of the prior art.
Figure 5:
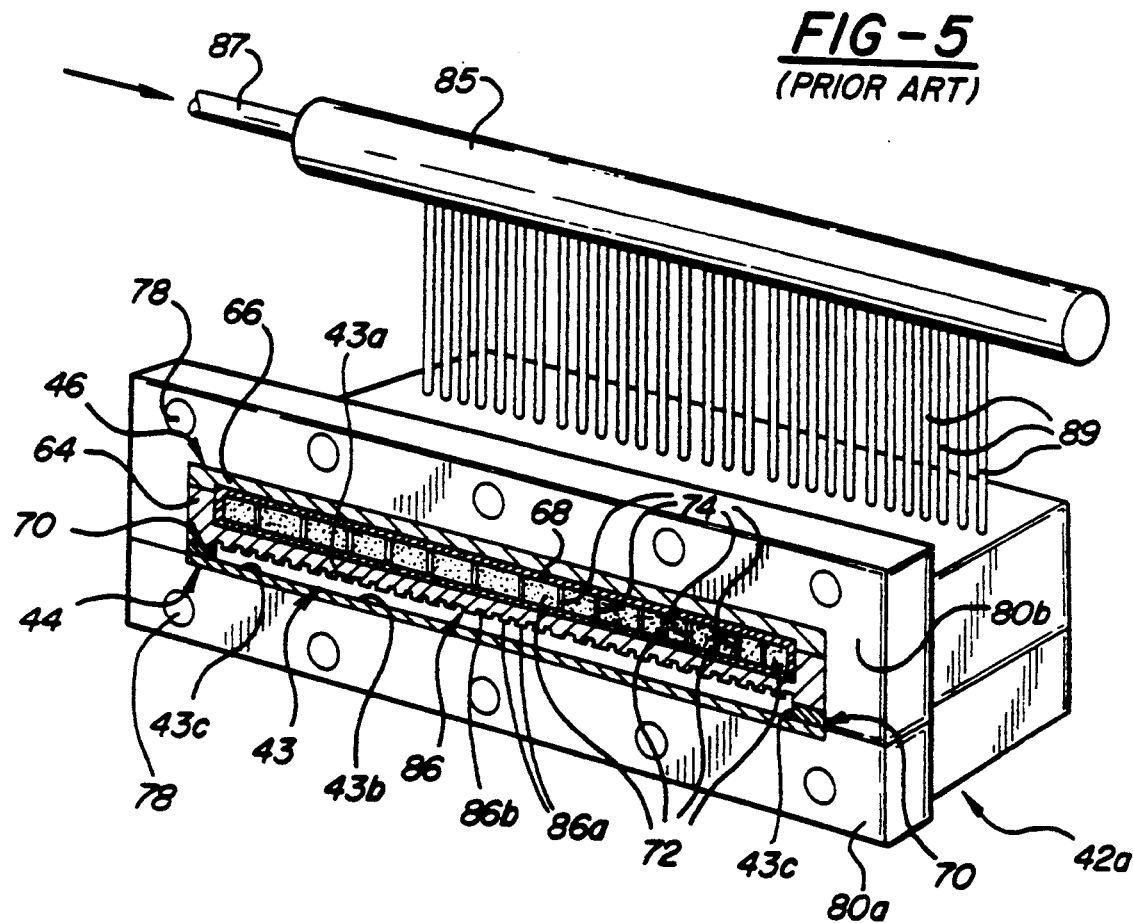
FIG. 5 is an enlarged, fragmentary perspective view, partially in cross-section, of the magnetic, grooved gas gate of the prior art, and specifically illustrating the intermediate sweep gas introduction assembly.

Referring now to FIGS. 4 and 5, like numerals refer to common elements of the prior art magnetic gas gates 42 and 42a. The gas gate 42a is shown to include a passageway 43 of generally rectangular cross-sectional configuration. The gas gate passageway 43 is defined by an upper wall 43a, a lower wall 43b opposite the upper wall, and opposed side walls 43c. The passageway 43 is partially formed by a recess 64 in the upper block 46 of the gas gate 42a into which is secured the magnetically attractive assembly adapted to urge the substrate into sliding contact with the upper gas gate passageway wall 43a. More particularly, an aluminum plate 66 and a stainless steel enclosure 68 are successively placed into the recess 64. A pair of elongated, relatively thin spacers 70 operate to both form the side walls 43c of the passageway 43 and fix the size of the passageway opening. As with the other prior art magnetic gas gate, the preferred height of the spacers is ⅛ inch, although the value can be as small as 1/16 inch; inside the stainless steel enclosure 68, a plurality of ceramic magnets 72 are arranged in a plurality of rows and columns by a plurality of substantially flat, elongated, non-magnetic separators 74; the top surface of the lower block 44 of the gas gate 42a forms the lower wall 43b of the passageway 43; both the lower block 44 and the upper block 46 include a plurality of apertures 78 on attachment plates 80a and 80b, respectively, for mounting the gas gate 42 between adjacent deposition chambers; and a port 82 provides access into the upper block 64 and the aluminum plate 66 for establishing communication with the recess 64.

In order for the inherently viscous inert gases to be swept through the relatively narrow, upper slit 82 between the web of substrate material and the upper wall 43a of the gas gate passageway 43 with sufficient velocity to substantially prevent the back diffusion of process gases from the dopant chambers into the intrinsic chamber, the upper wall 43a of the passageway 43 was formed with a plurality of elongated, generally parallel grooves 86 therein. The grooves 86 extend the entire approximately eight (8) inch length of the gas gate passageway 43 so as to operatively communicate at one end with the dopant deposition chamber and at the other end with the intrinsic deposition chamber. Each of the parallel grooves 86 is defined by opposed side walls 86a and an upper wall 86b. The unlayered surface of the web of substrate material 11 is urged against the upper, one-eighth inch wide passageway walls 43a which are defined as the surfaces formed between adjacent grooves 86. The side walls 86a extend downwardly approximately one-eighth (⅛) inch and are separated by the upper wall 86b which is about one-quarter (¼) inch wide, thereby providing a plurality of one-eighth inch high and one-quarter inch wide flow channels between deposition chambers. Since the flow channels are significantly greater than 200 microns (the point of maximum back diffusion), the velocity of gases flowing therethrough is substantially increased relative to the velocity of the gases flowing through the ungrooved upper slits of prior art gas gates. Therefore, the one-quarter inch passageway opening provided above the substrate, permits only minimal back diffusion of process gases from the dopant deposition chamber to the intrinsic deposition chamber.

It should be appreciated that the molecules of gases flowing through the upper slit 82 may either travel through the flow channels defined by the grooves 86 or through the relatively narrow space between adjacent grooves 86. The inert gases flowing through the grooves 86 are able to attain sufficient velocity to substantially prevent back diffusion of process gases. The inert gases flowing through the relatively narrow space between grooves are not able to attain sufficient velocity. However, due to the eight inch long path which the dopant process gases must traverse to diffuse into the intrinsic chamber, it is statistically improbable that the dopant gases will complete the journey to the intrinsic chamber without entering the high velocity flow channel grooves. Once in the high velocity grooves, those dopant process gases will move with the flow of the inert sweep gases and be returned to the dopant chamber. In this manner, contamination of the intrinsic chamber caused by dopant process gases diffusing through the upper passageway slit 82 has been substantially reduced.

While the grooves 86, taken in combination with the introduction of sweep gases adjacent the intrinsic deposition chamber side of the gas gate passageway 43, substantially reduce diffusion problems, it has been determined that the introduction of additional sweep gas directly into grooves 86 about midway between the adjacent deposition chambers provides an additional reduction in back diffusion of dopant process gases into the intrinsic deposition chamber. This was deemed necessary when it was found that only a small percentage of the sweep gas introduced from the intrinsic deposition chamber actually flows through the narrow upper slit 82.

Again, as was stated before, although these prior art magnetic gas gates reduced the overall cross-contamination of process gases from the dopant deposition chamber into the intrinsic deposition chamber through the gas gate passageway, substantial frictional abrasion between the upper passageway wall and the unlayered surface of the substrate occurred.

C. Magnetic Roller, Gas Gate of the Prior Art

The magnetic roller, gas gates of the prior art are substantially similar to the magnetic sliding gas gates, and in the following paragraphs only the differences therebetween will be described. It is important to note, however, that the magnetic roller gas gate contains all of the undescribed elements of the magnetic sliding gas gates.

Figure 7:
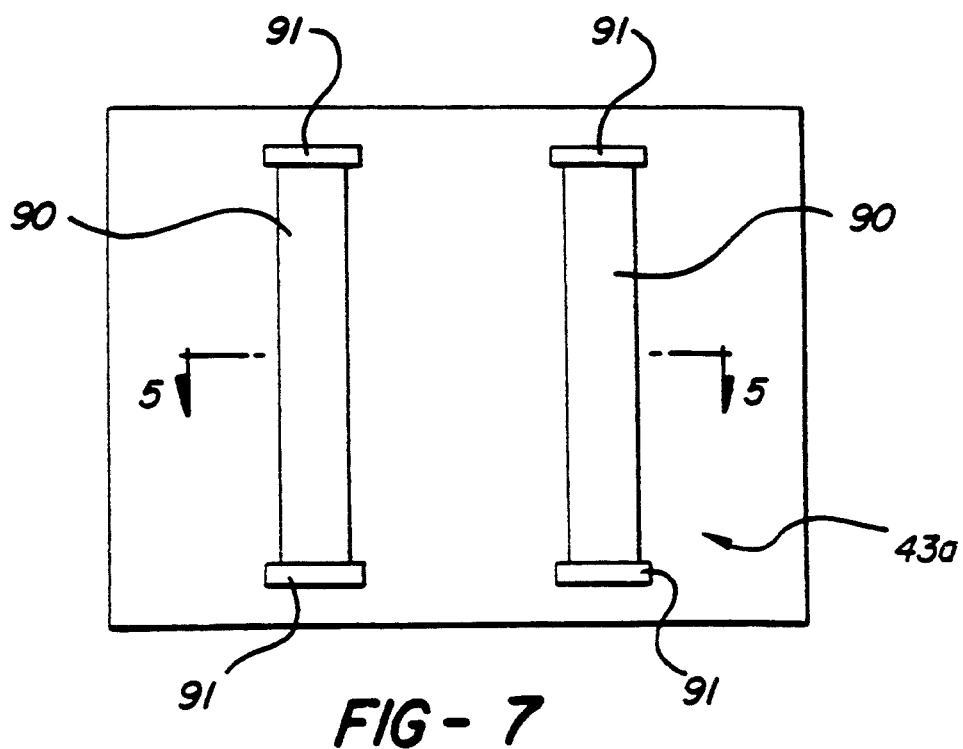
FIG. 7 is a cut-away view of upper passageway wall of the magnetic roller gas gate of the prior art illustrating the magnetic rollers of FIG. 6 and mounting brackets therefor.

Turning now to FIG. 7 there is shown therein a cutaway view of the upper passageway wall specifically depicting the magnetic rollers 90 of the gas gates. The spacedly disposed magnetic rollers 90 are rotatably mounted to the upper passageway wall 43a by means of bearings and mounting brackets 91. The preferred diameter of the magnetic rollers 90 is about one inch, although a range of diameters of about one-half inch to about three inches will operate.

From a perusal of FIG. 7, the difference between the magnetic sliding gas gate and the magnetic roller gas gate can be seen. The flat and grooved magnetic sliding surfaces of the upper passageway wall of the sliding gas gate have been supplemented by the magnetic rollers 90. This substitution resulted in a substantial reduction of frictional abrasion between the unlayered surface of the magnetically attractable web of substrate material 11 and the magnetic attracting means without substantial reduction in gas containment (i.e., without a substantial increase in the diffusion of process gases between adjacent deposition chambers).

Figure 8:
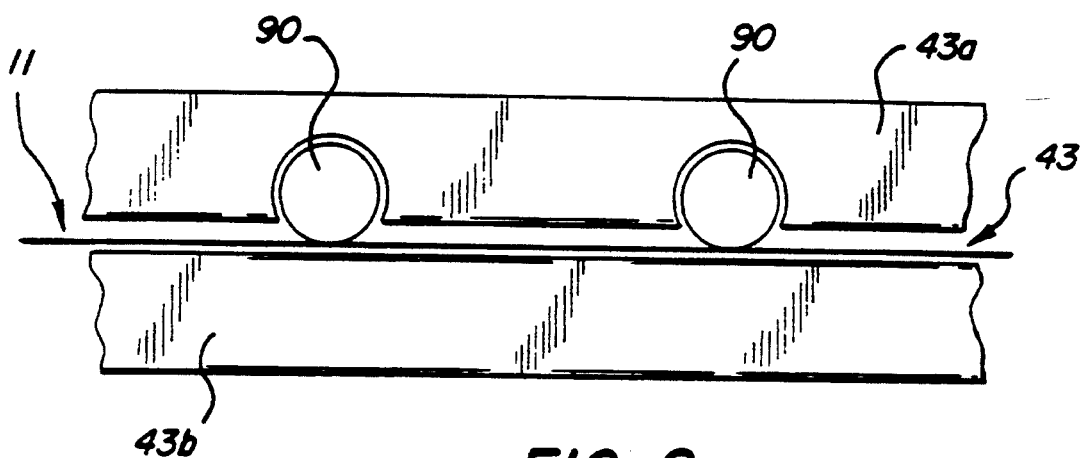
FIG. 8 is a partial cross sectional view taken along line 5—5 of FIG. 7 and specifically illustrating the disposition of the magnetic rollers of FIG. 6 spacedly disposed and rotatably mounted within the top passageway wall of the magnetic roller gas gate of the prior art.

Turning next to FIG. 8, there is depicted a cross-sectional view of the magnetic roller gas gate of the prior art taken along line 5—5 of FIG. 7. This figure depicts the manner in which the magnetic rollers 90 are mounted in semi-cylindrical openings or slots formed within the upper passageway wall 43a. Although FIG. 8 is not to scale, it should be noted that space between the magnetic rollers 90 and the upper passageway wall 43a is on the order of the height of passageway 43. The magnetic rollers 90 protrude into the passageway opening 43 so that the magnetically attractable substrate 11 will be held sufficiently far away from the contact surface of the upper passageway wall to prevent the formation of a relatively narrow upper slit, as was the problem with the flat surface sliding gas gate of the prior art. The magnetic rollers 90 protrude about 4 millimeters into the passageway 43. Therefore, the distance between the upper passageway wall and the unlayered surface of the substrate 11 will be approximately 4 millimeters. The distance between the lower passageway wall 43b and the layered surface of the substrate 11 is also about 4 millimeters. Therefore, taking into account the thickness of the substrate 11 and any deposited layers of silicon alloy material, passageway 43 should preferably be formed with about a 1 centimeter distance separating the lower passageway wall 43b and upper passageway wall 43a. The magnetic rollers 90 preferably extend the entire width (approximately 16 inches) of the passageway opening 43. As viewed in FIG. 8, the magnetically attractable substrate 11 would travel from left to right with rolling contact between the magnetic rollers 90 and the unlayered surface of the substrate.

Figure 6:
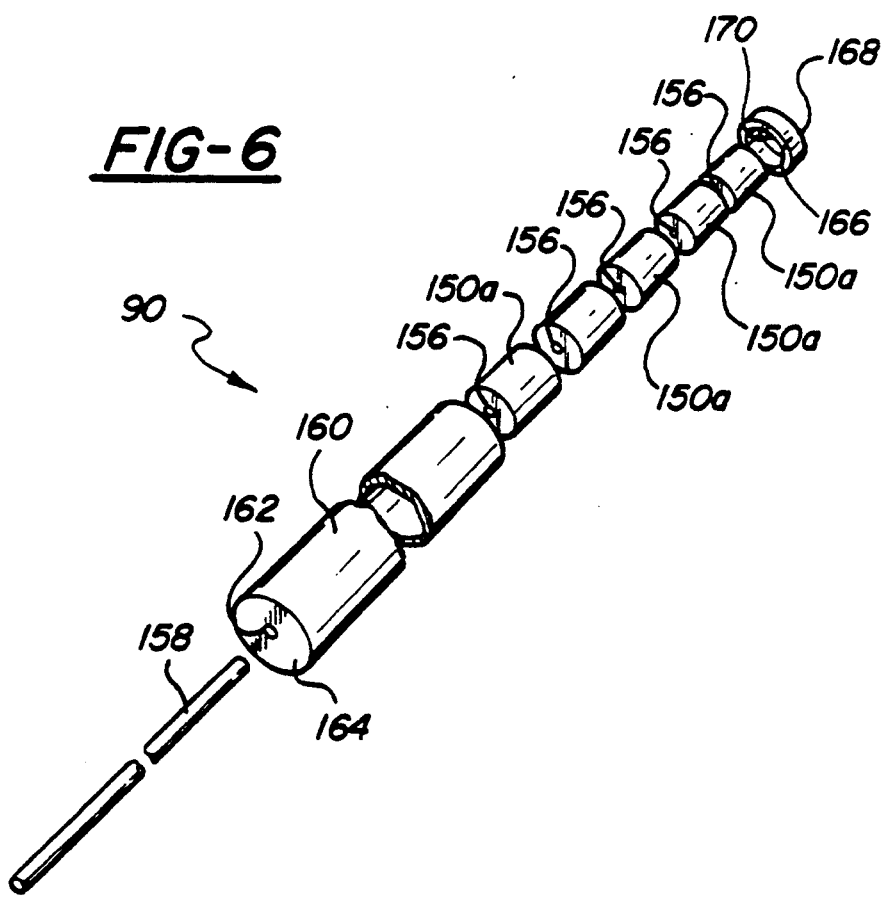
FIG. 6 is an enlarged, exploded perspective view of a preferred embodiment of the magnetic roller of the present invention wherein rotatably mounted, tubular magnets are encapsulated by an elongated hollow tube and adapted to be rotatably secured by an axle within the magnetic roller gas gate of the prior art.

Now turning to FIG. 6, there is depicted in this drawing one embodiment of the magnetic rollers 90 which are incorporated into the magnetic roller gas gate of the prior art and the transonic flow gas gate of the instant invention. The magnets 150a take the form of one or more axially apertured, generally cylindrically-shaped, ceramic magnets. The magnets 150a are preferably fashioned from a ceramic material (such as BaO-Fe$_2$O$_3$) because such ceramics materials are inherently light weight, relatively inexpensive, stable at elevated temperatures and capable of creating strong magnetic fields. However, any magnetic material which is capable of providing non-contaminating strong substrate attractive forces at the elevated temperatures and reduced pressures required for deposition of the amorphous semiconductor layers may be used. The axial aperture 156 is adapted to receive therein an elongated axle 158. An elongated, hollow generally cylindrically-shaped tube 160, having an internal diameter approximately equal to the outer diameter of the cylindrical magnets 150a, is adapted to receive at least one of the magnets 150a. The tube 160 has an aperture 162 formed through the closed end 164 thereof and a corresponding aperture 170 formed through the end wall 166 of and end cap 168 which cooperates with the tube 160 to encapsulate the cylindrical magnets 150a. As the magnetically attractable web of substrate material 11 is urged against the magnetic rollers 90, the magnetic rollers rotate about the longitudinal axis 158, thereby reducing frictional abrasion of the unlayered surface of the substrate.

D. Transonic Flow Gas Gate of the Instant Invention

Figure 9:
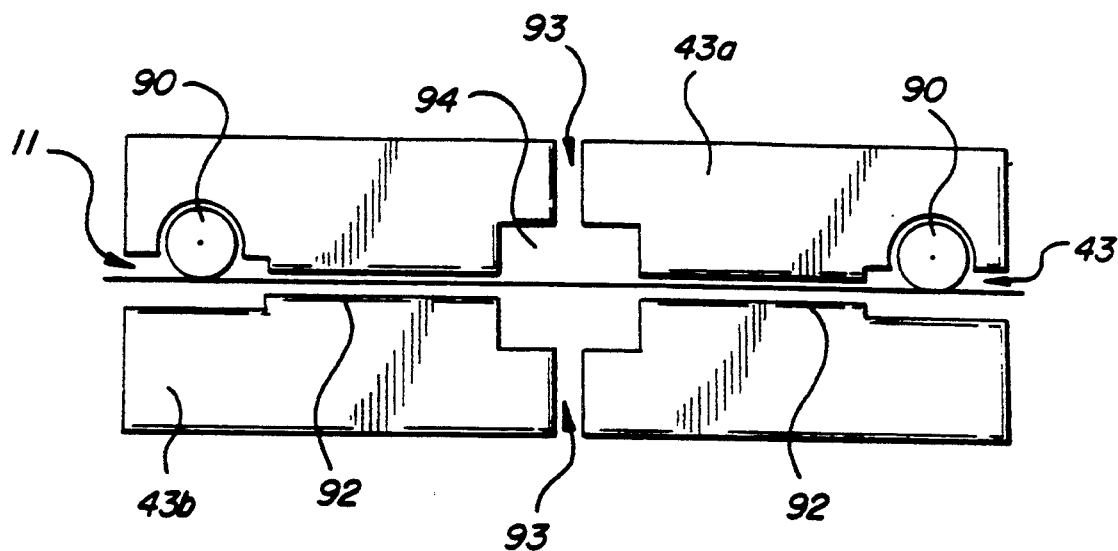
FIG. 9 is a cross sectional view of the isolation device of the instant invention specifically illustrating the transonic flow channels, sweep gas inlet, sweep gas manifold, and placement of the magnetic rollers of FIG. 6.

Turning now to FIG. 9, wherein is depicted a cross sectional view of the isolation device of the instant invention. As with the Magnetic roller gas gate of section C above, most of the features of the instant gas gate are identical to those of the prior art sliding gas gates. Therefore, only the differences/improvements of the present invention will be noted and discussed.

As in the prior art magnetic roller gas gate, the instant isolation device employs magnetic rollers 90 to accurately and safely guide a magnetically attractable substrate 11 through passageway 43. As stated herein above, the magnetic rollers 90 reduce frictional abrasion of the substrate 11.

The present invention is unique in its ability to isolate gaseous regions of highly differing pressure. The prior art gas gates could not effectively isolate regions having pressure differentials of greater than about 10%. However, there are many instances where it is desirable to isolate gaseous regions having greater pressure differentials than are achievable by the prior art gas gates. For instance, it may be desirable to isolate a low vacuum payout reel chamber containing essentially atmospheric gases at a pressure of about 250 mTorr from an adjacent back reflector deposition chamber at a pressure of about $10^{-3}$ Torr. With the prior art gas gates, this isolation would be essentially impossible to achieve.

The isolation achievable by the present invention stems from the transonic flow of inert sweep gas through the transonic flow channels 92. Inert sweep gas enters the gas gate through inlet 93 and flows into gas manifold 94. Manifold 94 allows the pressure of the inert gas to equalize and provides for the required differing flow rates in each of the transonic flow channels due to the differing pressures in the interconnected regions. In the specific example discussed directly above, the height of the transonic flow channels 92 is about 0.125 inches and the length thereof is about 2.0 inches. The non-contaminating sweep gas is argon and it is flowing into the inlet 93 at a rate of approximately 400 sccm. The effect of the gas upon the environment of the deposition chamber is minimal because the argon sweep gas is used as the diluent gas which would normally have been used in the reaction chamber. Therefore the reaction mixture is no more diluted than normal and the evacuation pump has no greater pumping burden than normal.

Figure 10:
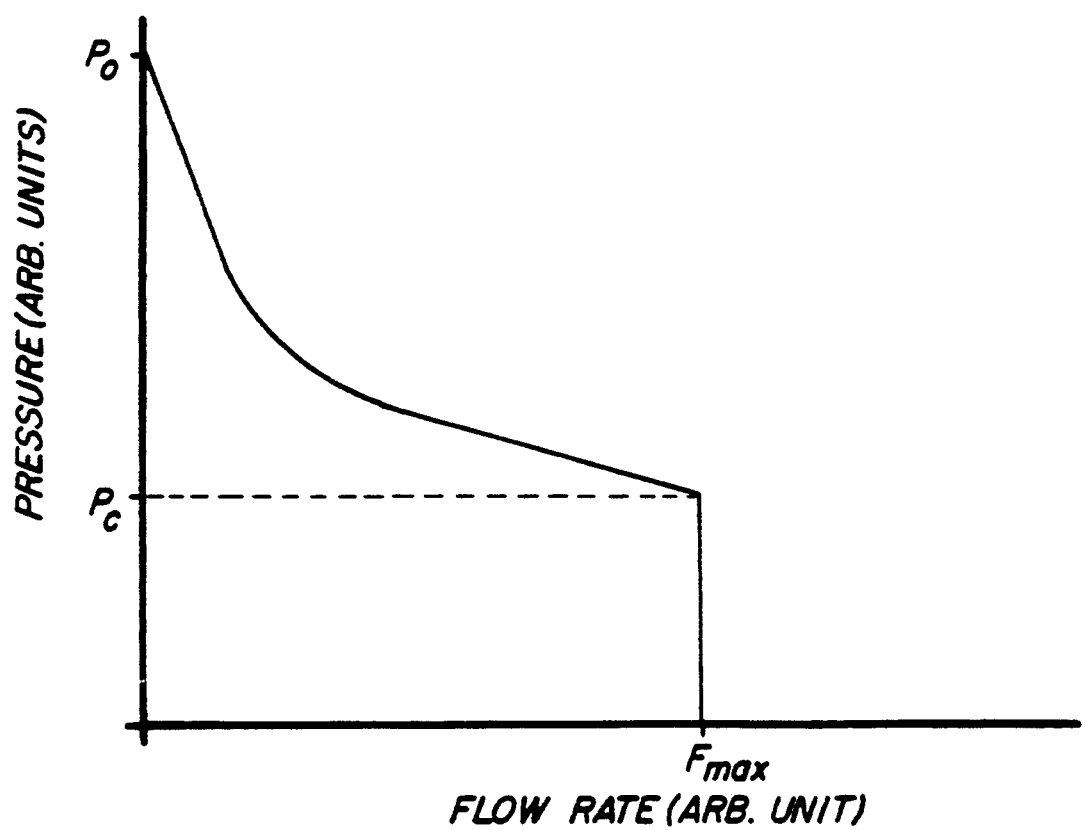
FIG. 10 is a graphical representation of the relationship between the pressure in an adjacent chamber (or region), plotted on the ordinate, and the flow of non-contaminating gas in the transonic flow channel 92, plotted on the abscissa.

Next a brief description of the physics/mechanics of the gas gate of the instant invention is in order. FIG. 10 is a graphical representation of the relationship between the pressure in an adjacent chamber (or region), plotted on the ordinate, and the flow of non-contaminating gas in the transonic flow channel 92, plotted on the abscissa. As can be seen from a perusal of this figure, when the pressure in the chamber is equal to the pressure in manifold 94 ($P_o$), there is no flow of non-contaminating gas in transonic flow channel 92. As the pressure in the chamber drops, the flow of non-contaminating gas increases, until a point at which the gas in the channel 92 is transonic. This critical pressure is denoted as $P_c$ and the flow at this pressure is denoted as $F_{max}$. Any reduction in the pressure of the chamber beyond the critical pressure will not increase the flow rate of the gas through transonic flow channel 92.

At pressures lower than this critical pressure, the system gas flows are locked and will not increase, regardless of how low the pressure in the chamber is reduced. This can be shown by a consideration of the relative velocities of the gas in the channel 92 and pressure disturbances in the adjacent chamber. Pressure disturbances within a gas (sounds, pressure drops etc.) travel in the gas at the "speed of sound" in that gas. Therefore, any pressure change in the chamber is transmitted up channel 92 at the speed of sound. However, at chamber pressures below $P_c$, the flow rate of gas in channel 92 is transonic (beyond the speed of sound). Therefore the pressure disturbance will never propagate upstream within the region transonic flow channel 92. Therefore, any further reduction of pressure (i.e. pressure disturbance) within the adjacent chamber or region will not be communicated upstream and therefore the gas flow rate in the flow channel is locked at $F_{max}$. Also it can be seen that once the system flow rates are locked, the pressure in the channel 92 is always greater than or equal to $P_c$. This locked flow mode is also called a choked mode.

The previous paragraphs have described the pressure isolation mechanism of the improved gas gate of the instant invention, however, there is also the consideration cross contamination by diffusion of materials upstream. This can happen when the mean-free-path length of the diffusing species is large. However, as was stated hereinabove, once the system flows are locked, the pressure within the transonic flow channel 92 is greater than or equal to $P_c$. Therefore, the instant gas gate uniquely provides for isolation of diffusing gaseous species by reducing the mean-free-path length (i.e. distance between collisions) of the diffusing species within the transonic flow channel 92. The sweep gas within the flow channels 92 is at high enough pressure to considerably reduce the mean-free-path length of diffusing species. Therefore, the since the required length of the transonic flow channels 92 need only be a few mean-free-path lengths long to provide adequate isolation of diffusing species and the mean-free-path length within the high pressure flow channel 92 is small, the overall length of the gas gate of the instant is significantly smaller than the gas gates of the prior art, while still providing the required isolation of diffusing species.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

We claim:

1. A gas gate for interconnecting two regions of differing gaseous composition and/or pressure; said gas gate includes a narrow, elongated passageway, through which substrate material is adapted to move between said regions, and inlet means for introducing a flow of non-contaminating sweep gas into a central portion of said passageway, said gas gate is characterized in that:
   the height of at least about a 2 inch portion of the passageway is about 0.125 inches and the flow rate of the sweep gas therethrough is about 400 SCCM, thereby providing for choke mode transonic flow of the sweep gas between the inlet means and at least one of the two interconnected regions.

2. A gas gate as in claim 1, wherein manifold means is formed at the point where said inlet means communicates with said passageway.

3. A gas gate as in claim 2, wherein the gas gate includes a 2 inch portion with a height dimension of 0.125 inches positioned between said manifold means and at least one of said two interconnected regions.

4. A gas gate as in claim 2, wherein the gas gate includes a 2 inch portion with a height dimension of 0.125 inches positioned between said manifold means and both said two interconnected regions.

5. A gas gate as in claim 1, wherein roller means are spacedly disposed and rotatably mounted along the upper passageway wall.

6. A gas gate as in claim 5, wherein magnetic means for urging a magnetically attractable substrate into rolling contact with said rotatably mounted roller means, whereby frictional abrasion of said substrate by said passageway walls is reduced.

7. A gas gate as in claim 6, wherein said magnetic means are formed from permanent magnet material.

8. A gas gate as in claim 7, wherein said magnet material is ceramic magnet material.

9. A gas gate as in claim 8, wherein said roller means are formed of said ceramic magnet material.

10. A gas gate as in claim 6, wherein said magnetic means are disposed within said roller means.

11. A gas gate as in claim 1, wherein at least one of said interconnected regions is a chamber adapted to deposit a layer of material onto a substrate.

12. A gas gate as in claim 11, wherein said layer of material is semiconductor alloy material.

13. A gas gate as in claim 11, wherein both of said interconnected regions are chambers adapted to deposit a layer of material onto a substrate.

14. A gas gate as in claim 13, wherein an intrinsic layer of semiconductor alloy material is deposited onto the substrate in one of said chambers, and a doped layer of semiconductor alloy material is deposited onto the substrate in the other of said chambers.

15. A gas gate as in claim 13, wherein each of said chambers is adapted to deposit a doped layer of semiconductor alloy material onto the substrate.

* * * * *